United States Patent
Hasegawa et al.

(10) Patent No.: US 7,797,591 B2
(45) Date of Patent: Sep. 14, 2010

(54) SEMICONDUCTOR INTEGRATED CIRCUIT, DESIGN SUPPORT SOFTWARE SYSTEM, AND AUTOMATIC TEST PATTERN GENERATION SYSTEM

(75) Inventors: Tetsu Hasegawa, Yokohama (JP); Chikako Tokunaga, Yokohama (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 12/503,336

(22) Filed: Jul. 15, 2009

(65) Prior Publication Data
US 2009/0282285 A1   Nov. 12, 2009

Related U.S. Application Data

(62) Division of application No. 11/526,881, filed on Sep. 26, 2006, now Pat. No. 7,577,885.

(30) Foreign Application Priority Data
Sep. 29, 2005   (JP) .............................. 2005-284429

(51) Int. Cl.
*G11C 29/00* (2006.01)

(52) U.S. Cl. ............................... 714/710; 714/5; 714/7; 714/8; 714/42; 714/54; 714/711; 714/718; 714/719; 714/733; 714/734; 714/743; 365/201

(58) Field of Classification Search ........................ None
See application file for complete search history.

(56) References Cited

U.S. PATENT DOCUMENTS

| 6,128,750 A * | 10/2000 | Espy et al. ..................... 714/7 |
| 6,704,916 B1 * | 3/2004 | Nishida et al. ................ 716/10 |
| 6,961,347 B1 * | 11/2005 | Bunton et al. ............... 370/465 |
| 7,146,547 B2 * | 12/2006 | Fukatsu ..................... 714/718 |
| 7,457,996 B2 * | 11/2008 | Kobayashi et al. .......... 714/718 |
| 2004/0136319 A1 * | 7/2004 | Becker et al. ............... 370/225 |
| 2005/0022065 A1 * | 1/2005 | Dixon et al. ................. 714/42 |
| 2005/0055173 A1 * | 3/2005 | Eustis et al. ................ 702/118 |
| 2005/0108458 A1 * | 5/2005 | Vogt ............................. 711/1 |

OTHER PUBLICATIONS

Y. Onozaki, "Design of Testability of the System LSI" (Japanese) from Design Wave Magazine, CQ Publishing Co., Ltd., Aug. 2002, p. 81-90 and partial English translation of relevant pages.

* cited by examiner

*Primary Examiner*—John P Trimmings
(74) *Attorney, Agent, or Firm*—Banner & Witcoff, Ltd

(57) ABSTRACT

A semiconductor integrated circuit has a memory circuit having memory cells, a first register, a second register, a register selection circuit having an input to which an output of the first register and an output of the second register are connected, a memory bypass circuit which is located between a first switching circuit and a second switching circuit, and connected to the inputs and the outputs of the memory circuit. The register selection circuit is switched to the output signals of the first register when performing testing by way of the memory circuit, and switched to output signals of the second register when performing testing by way of the memory bypass circuit.

2 Claims, 5 Drawing Sheets

SEMICONDUCTOR INTEGRATED CIRCUIT, DESIGN SUPPORT SOFTWARE SYSTEM, AND AUTOMATIC TEST PATTERN GENERATION SYSTEM

CROSS-REFERENCE TO RELATED APPLICATION

This application is a divisional of U.S. Ser. No. 11/526,881, filed Sep. 26, 2006, which claims priority under 35 U.S.C. §119 to Japanese Patent Application No. 2005-284429, filed on Sep. 29, 2005. The entire disclosures of the prior applications are hereby incorporated herein by reference.

BACKGROUND OF THE INVENTION

1. Field of the Invention

The present invention relates to a semiconductor integrated circuit for testing stuck-at faults and delay faults of a repair circuit, for example, in a memory having a redundant configuration and relates to a design support software system and an automatic test pattern generation system.

2. Background Art

Some techniques for detecting faults of devices in a manufacturing test use a BIST (built-in self test) circuit, for example, which tests a memory circuit set in a semiconductor integrated circuit.

Methods for detecting faults in a memory circuit include, for example, a comparator-type BIST method in which comparison is made between written-in data and read-out data for determination on the presence of faults, or a compressor-type BIST method in which read-out data is compressed in a BIST circuit and a determination on the presence of faults is made based on the compressed data.

Further, some memory circuits have a memory having a redundant configuration for repairing a faulty cell. This memory having a redundant configuration has a redundant cell for repair other than normal memory cells, and where fault occurs in a memory cell, offers repair by avoiding the faulty cell and using the redundant cell, so that a normal operation as a memory circuit is carried out.

The memory having a redundant configuration includes, for example, normal memory cells, a redundant cell, and a repair logic consisting of a blowing type fuse circuit, a fuse register, a repair code decoding circuit, and an input-output switching circuit. It should be appreciated that a technology for distributing the repair logic as a logic circuit outside a memory circuit is referred to as a "soft-macro type redundancy repair technology".

When the above fuse circuit is used for repair, a repair code is determined based on the results of a test for the memory circuit. Then, according to the repair code, a corresponding fuse bit in the fuse circuit is fused so as to be fixed in a repaired state. Then, switching is carried out by the input-output switching circuit from the faulty cell of the normal memory cells to the redundant cell, so that normal reading-out/writing-in operation avoiding the faulty cell can be performed (see Japanese Laid-Open Publication No. 2004-192712, for example).

When the memory having a redundant configuration is tested by means of a BIST circuit, the comparator-type BIST method is typically used. In this case, a repair code is produced by a BIRA (built-in redundancy allocation) circuit based on the comparison results produced through the comparator-type BIST method.

Under such circumstances, where the soft-macro type redundancy repair technology mentioned above is used, detection of stuck-at faults, or static faults, of a semiconductor integrated circuit embedded in the memory circuit is performed by providing a bypass circuit for bypassing the memory circuit, giving a scan design to the fuse register, and automatically generating a stuck-at fault test pattern.

By "scan design" is meant to constitute a shift register by replacing a register in a logic circuit with a scan register having a test input and a test output, and connecting the test input and the test output in series with each other. Thus, signal setting and observation can be directly performed for the register from an external terminal.

In this way, stuck-at faults of the decoding circuit and the input-output switching circuit are tested by giving a scan design to the fuse register, and adding a bypass circuit for bypassing the memory circuit. Once the bypass circuit is added after giving a scan design to the fuse register, stuck-at faults of the decoding circuit and the input-output switching circuit become testable.

On the other hand, detection of delay faults that cause delay in the semiconductor integrated circuit is performed by automatically generating a sequential delay fault test pattern, in a state where reading/writing for the memory circuit is possible.

In case the sequential delay fault test pattern for performing reading/writing for the memory cells is automatically generated in order to detect delay faults, the input-output switching circuit is required to be controlled by inputting a repair code into the fuse register, so as not to produce a test pattern for performing reading/writing for the faulty cell.

In this regard, in case a scan design has been provided to the fuse register in order to test stuck-at faults, as described above, the delay fault test pattern has to be configured as a pattern for inputting/outputting a repair code into/from the fuse register.

Accordingly, while the fact that the test pattern is for detecting delay faults remains unchanged, a different test pattern for every repair code has to be set by a tester. In other words, a measure, such as to provide a pattern storage capacity to the tester for inputting the test pattern is necessitated, which storage capacity has to be sufficient for holding shift patterns corresponding to all the repair codes, thus raising a problem of increasing cost.

SUMMARY OF THE INVENTION

According one aspect of the present invention, there is provided: a semiconductor integrated circuit comprising: a memory circuit having memory cells and a redundant cell for avoiding a faulty cell among the memory cells, in which fault has occurred, to achieve repair; a fuse circuit in which a logic for repairing said memory circuit is determined based on a repair code for avoiding said faulty cell detected as a result of testing said memory circuit and for using the redundant cell; a first register which is controlled by output signals from said fuse circuit; a second register having a scan design and having a test input and a test output; a register selection circuit having an input to which an output of said first register and an output of said second register are connected, and performing switching between output signals of said first register and output signals of said second register to output signals; a first switching circuit which is connected between a first user circuit and inputs of said memory circuit, and switches the inputs of said memory circuit from a first signal path including a path to which said faulty cell is connected, to a second signal path including a path to which said redundant cell is connected for avoiding the path to which said faulty cell is connected; a second switching circuit which is connected between a second user circuit and outputs of said memory circuit, and switches the outputs of said memory circuit from said first signal path to said second signal path; a memory bypass circuit which is located between said first switching circuit and said second switching circuit, and connected to the inputs and the outputs of said memory circuit; and a decoding circuit configured to output signals for controlling said first switching circuit and said second switching circuit based on an input from said register selection circuit.

According other aspect of the present invention, there is provided: a design support software system configured to support a test circuit design of a semiconductor integrated circuit comprising a memory circuit having memory cells and a redundant cell for avoiding a faulty cell among the memory cells, in which fault has occurred, to achieve repair; a fuse circuit in which a logic for repairing said memory circuit is determined based on a repair code for avoiding said faulty cell detected as a result of testing said memory circuit and for using the redundant cell; a first register which is controlled by output signals from said fuse circuit; a second register having a scan design and having a test input and a test output; a register selection circuit having an input to which an output of said first register and an output of said second register are connected, and performing switching between output signals of said first register and output signals of said second register to output signals; a first switching circuit which is connected between a first user circuit and inputs of said memory circuit, and switches the inputs of said memory circuit from a first signal path including a path to which said faulty cell is connected, to a second signal path including a path to which said redundant cell is connected for avoiding the path to which said faulty cell is connected; a second switching circuit which is connected between a second user circuit and outputs of said memory circuit, and switches the outputs of said memory circuit from said first signal path to said second signal path; a memory bypass circuit which is located between said first switching circuit and said second switching circuit, and connected to the inputs and the outputs of said memory circuit; and a decoding circuit configured to output signals for controlling said first switching circuit and said second switching circuit based on an output from said register selection circuit, comprising a redundancy circuit producing portion configured to produce a redundancy circuit file based on an input from a redundant memory information file including information on cell names and on address width/bit width repair processes of said memory circuit; and a circuit incorporation portion configured to produce a second net list in which redundancy circuits are incorporated, based on inputs from said redundancy circuit file, a first net list of said semiconductor integrated circuit which is subjected to incorporation of said redundancy circuits, a fault test register specifying file for specifying a second register, and a redundant memory instance specifying file for specifying a logical location of said memory circuit.

According other aspect of the present invention, there is provided: An automatic test pattern generation system configured to generate automatically test patterns for testing semiconductor integrated circuit comprising a memory circuit having memory cells and a redundant cell for avoiding a faulty cell among the memory cells, in which fault has occurred, to achieve repair; a fuse circuit in which a logic for repairing said memory circuit is determined based on a repair code for avoiding said faulty cell detected as a result of testing said memory circuit and for using the redundant cell; a first register which is controlled by output signals from said fuse circuit; a second register having a scan design and having a test input and a test output; a register selection circuit having an input to which an output of said first register and an output of said second register are connected, and performing switching between output signals of said first register and output signals of said second register to output signals; a first switching circuit which is connected between a first user circuit and inputs of said memory circuit, and switches the inputs of said memory circuit from a first signal path including a path to which said faulty cell is connected, to a second signal path including a path to which said redundant cell is connected for avoiding the path to which said faulty cell is connected; a second switching circuit which is connected between a second user circuit and outputs of said memory circuit, and switches the outputs of said memory circuit from said first signal path to said second signal path; a memory bypass circuit which is located between said first switching circuit and said second switching circuit, and connected to the inputs and the outputs of said memory circuit; and a decoding circuit configured to output signals for controlling said first switching circuit and said second switching circuit based on an output from said register selection circuit, comprising: a first fault test pattern generating portion configured to generate a first fault test pattern file based on inputs from a net list in which redundancy circuits are incorporated, a cell library, a scan design information file for defining scan designs of said semiconductor integrated circuits, and a first fault test mode setting information file for specifying a test's being a first fault test; and a second fault test pattern generating portion configured to generate a second fault test pattern file based on inputs from said net list, said cell library, said scan design information file, a repair code file for specifying an optional repair code, a second fault test mode setting information file for specifying a test's being a second fault test, and a fuse register instance specifying file.

DETAILED DESCRIPTION

Semiconductor integrated circuits according to some embodiments of the present invention enable testing of stuck-at faults in a user circuit and a repair circuit with the aid, for example, of a test register provided with a scan design, or a register in a BIRA circuit, and also enable testing of delay faults using a delay fault test pattern not relying on a repair code written in a fuse circuit, with the aid of a fuse register not provided with a scan design.

With reference to the drawings, hereinafter are described some embodiments to which the present invention is applied.

First Embodiment

Figure 1:
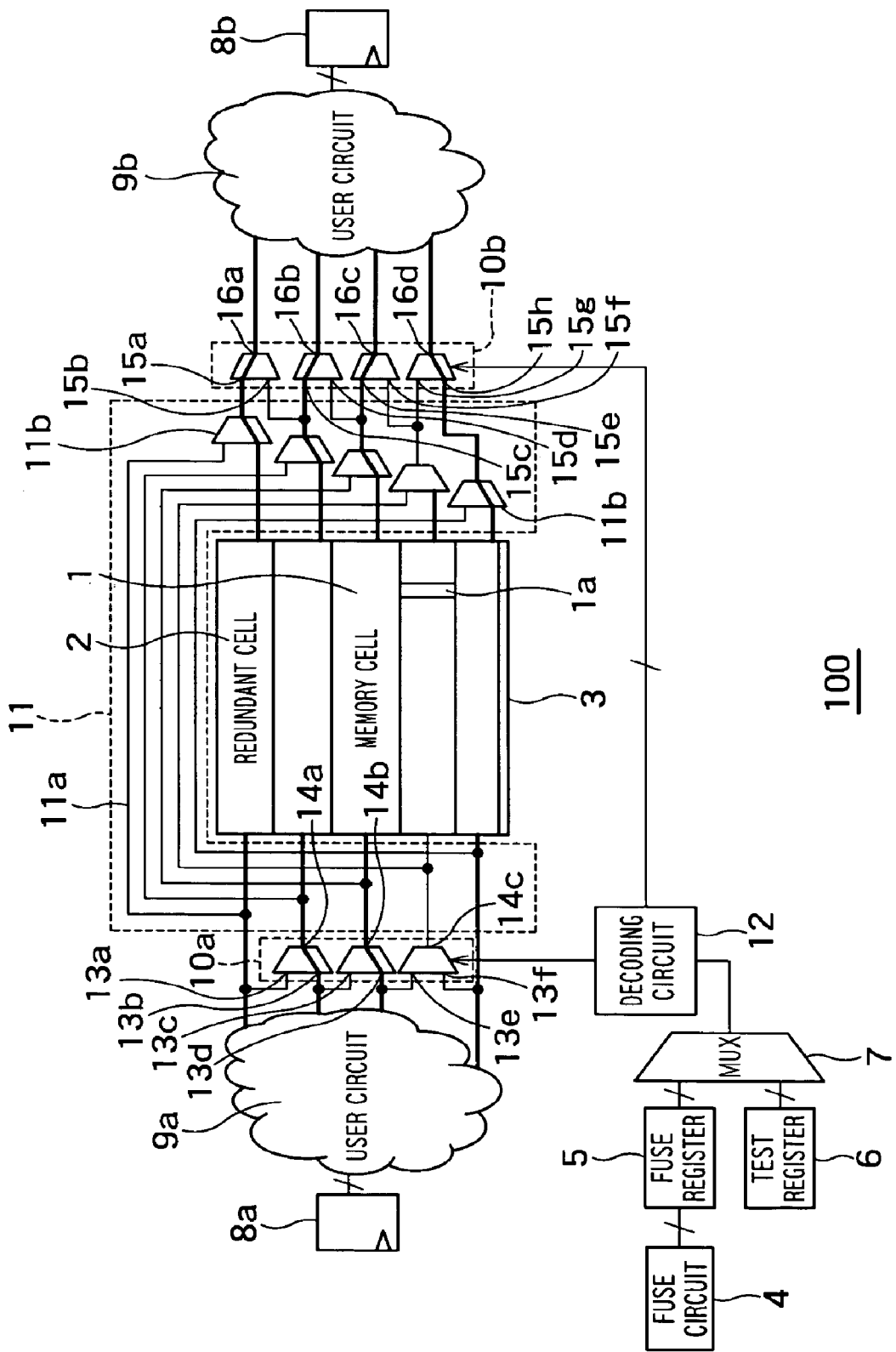
FIG. 1 is a block diagram illustrating a configuration of a principal part of a semiconductor integrated circuit according to a first embodiment of the present invention.

FIG. 1 is a block diagram illustrating a configuration of a principal part of a semiconductor integrated circuit according to a first embodiment of the present invention.

As shown in FIG. 1, a semiconductor integrated circuit 100 includes a memory circuit 3 having memory cells 1 and a redundant cell 2 for avoiding a faulty cell 1a among the memory cells 1, in which fault has occurred, to achieve repair; a fuse circuit 4 for determining a logic for repairing the memory circuit based on a repair code for avoiding the faulty cell 1a detected as a result of testing the memory circuit 3 and for using the redundant cell 2, and a fuse register 5, or a first register, which is controlled by output signals of the fuse circuit 4.

The semiconductor integrated circuit 100 further includes a stuck-at fault test register 6, or a second register, which is provided with a scan design for testing stuck-at faults, and has a test input and a test output; and a register selection circuit (MUX) 7, or a multiplexer, whose input is connected with an output of the fuse register 5 and the output of the stuck-at fault test register 6, so that, in outputting signals, when delay faults are to be tested, switching is performed to receive output signals of the fuse register 5, and when stuck-at faults are to be tested, switching is performed to receive output signals of the stuck-at fault test register 6.

The semiconductor integrated circuit 100 further includes a first flip-flop (FF) 8a and a second flip-flop 8b which are disposed in the semiconductor integrated circuit 100; a first user circuit 9a for processing output signals of the first flip-flop 8a and outputting predetermined signals; a second user circuit 9b for processing output signals of the memory circuit 3 and outputting predetermined signals; a first switching circuit 10a which is connected between the first user circuit 9a and inputs of the memory circuit 3 to switch the inputs of the memory circuit 3 from a first signal path including a path to which the faulty cell 1a is connected, to a second signal path including a path to which the redundant cell 2 is connected for avoiding the path to which the faulty cell 1a is connected; and a second switching circuit 10b which is connected between the second user circuit 9b and outputs of the memory circuit 3 to switch the outputs of the memory circuit 3 from the first signal path to the second signal path.

The semiconductor integrated circuit 100 further includes a memory bypass circuit 11 which is connected to the inputs and the outputs of the memory circuit 3 and disposed between the first switching circuit 10a and the second switching circuit 10b to test stuck-at faults; and a decoding circuit 12 for outputting signals to control the first and second switching circuits 10a and 10b based on the output of the register selection circuit 7.

It should be appreciated that the first and second switching circuits 10a and 10b here are each made up of a plurality of multiplexers.

Further, the memory bypass circuit 11 includes bypass wirings 11a whose each one end is connected between one of the inputs of the memory circuit 3 and an output of the first switching circuit 10a; and multiplexers 11b whose each input is connected with one of the outputs of the memory circuit 3 and the other end of the bypass wiring 11a, and whose each output is connected to an input of the second switching circuit 10b.

If the faulty cell 1a is present in the memory circuit 3 as shown in FIG. 1, a repair code is determined based on information outputted to an external tester through a BIRA circuit, not shown, for example, so that a fuse element in the fuse circuit 4 is fused for establishing a repair logic for every semiconductor integrated circuit 100. The repair code written in the fuse circuit 4 is read out to the fuse register 5 for control of the first switching circuit 10a and the second switching circuit 10b by the decoding circuit 12.

Upon reception of the control signals from the decoding circuit 12, each of the first switching circuit 10a and the second switching circuit 10b is controlled so that its multiplexers are switched to avoid the path to which the faulty cell 1a is connected and to transmit predetermined signals to the path to which the redundant cell 2 is connected.

Under such circumstances, once reading-out/writing-in operation for the memory circuit 3 is carried out by the first user circuit 9a that has received a predetermined output from the first flip-flop 8a, the memory circuit 3 normally outputs predetermined data using the second signal path including the path connected to the redundant cell 2 for avoiding the path to which the faulty cell 1a is connected. The outputted data is then introduced into the second flip-flop 8b through the second user circuit 9b.

Description is now provided on tests of stuck-at faults and delay faults in the semiconductor integrated circuit 100 having the configuration as described above. It should be noted that the description here is provided for the case where the tests of stuck-at faults and delay faults are performed with the memory circuit 3 being in a state of having been repaired.

The test of stuck-at faults (the test via the memory bypass circuit) is performed, for example, by inputting a predetermined test pattern into the first flip-flop 8a and the stuck-at fault test register 6, controlling the memory bypass circuit 11, detecting signals outputted to the second flip-flop 8b, and comparing the detected signals with a predetermined expectation value. Thus, the test of stuck-at faults is performed for the first and second user circuits 9a and 9b, the first and second switching circuits 10a and 10b, and the decoding circuit 12.

In this connection, when testing stuck-at faults, the memory bypass circuit 11 is rendered to switch the multiplexers 11b so as to select and output the signals that have been inputted from the first user circuit 9a and transmitted to the bypass wirings 11a bypassing the memory circuit 3.

In addition, as shown in FIG. 1, the bypass circuit 11 is arranged at a side nearer to the memory circuit 3 than the first and second switching circuits 10a and 10b. Accordingly, stuck-at faults not only in the first and second user circuits 9a and 9b but also in the first and second switching circuits 10a and 10b (particularly, stuck-at faults in input terminals 13a to 13h and output terminals 14a to 14c of the first switching circuit 10a, and input terminals 15a to 15f and output terminals 16a to 16d of the second switching circuit 10b, which include portions that do not operate when switched as a result of repair) can also be further tested.

As described above, being provided with a scan design, the stuck-at fault test register 6 has a scan register having the test input and the test output. Therefore, all the stuck-at faults can be tested by writing any test pattern into the stuck-at fault test register 6 that has been selected by the register selection circuit 7, from the test input and the test output, and by decoding the test pattern at the decoding circuit 12. This is because any combination can be dealt with in a controllable manner without relying on a repair code.

Owing to the repair of the memory circuit 3, whatever repair codes are written into the fuse circuit 4, the output of the fuse circuit 4 is not inputted to the stuck-at fault test register 6, whereby no influence is brought to a test pattern for testing stuck-at faults. Thus, a test pattern for testing stuck-at faults does not have to be prepared for every repair code.

On the other hand, the test of delay faults (the test via the memory circuit) is performed by, for example, inputting a predetermined test pattern from the first flip-flop 8a, bringing the memory circuit 3 into a state of being repaired, having the multiplexers 11b selected a memory output-side, detecting signals outputted to the second flip-flop 8b, and comparing the detected signals with a predetermined expectation value. For this purpose, the fuse register 5 is selected by the register selection circuit 7, and the memory circuit 3 is set to be in the state of being repaired by the decoding circuit 12 based on the output of the fuse register 5. Then, reading-out/writing-in operation is performed for the memory circuit 3 with a test pattern for delay faults. The reason why such a setting is enabled is that the fuse register 5 is not provided with a scan design, and that therefore the fuse register 5 is allowed to read out a repair code from the fuse circuit 4 as a normal operation (repaired-state operation) even in the test mode.

In this way, in the delay fault test mode, the memory bypass circuit 11 selects the output data of the memory circuit 3 in order to enable reading/writing of the memory cells 1. In FIG. 1, for the delay faults in the first and second switching circuits 10a and 10b, portions subjected to testing are those which operate in the repaired state of the memory (the input terminals 13b and 13d, the output terminals 14a and 14b, the input terminals 15a, 15c, 15e and 15h, and the output terminals 16a to 16d).

Accordingly, although the same test pattern is used, the portions to be tested in the first and second switching circuits 10a and 10b depend on the repair code written in the fuse circuit 4.

As described above, being not provided with a scan design, the fuse register 5 fetches a repair code from the fuse circuit 4 as a normal operation in the test mode for delay faults, thereby bringing the memory circuit 3 into a repaired state. Therefore, for example, no test pattern incorporating a repair code is required to be set in the tester, not shown. In other words, it is possible to utilize and input from the tester a generally used test pattern not relying on a repair code.

In this way, comparing with the conventional art described above, the semiconductor integrated circuit 100 is additionally provided with the stuck-at fault test register 6 in which a scan design is given to the bit width/number of the fuse register 5, and with the register selection circuit 7. Thus, the first and second user circuits 9a and 9b, the pattern for enabling test of stuck-at faults throughout the repair circuit, and the test pattern for delay faults that performs reading/writing for the memory circuit 3, are ensured to be utilized without relying on a repair code of the fuse circuit 4.

As described above, the semiconductor integrated circuit of the present embodiment enables test of stuck-at faults in the user circuits and the repair circuit, and enables production of a test pattern for delay faults in the user circuits, which performs reading/writing of memory, as a pattern without relying on a repair code.

Accordingly, it is no longer necessary to take such measures, for example, as to separately provide a pattern storage capacity in a tester in order to produce a test pattern for delay faults corresponding to a repair code, thereby reducing costs for testing stuck-at faults and delay faults.

Second Embodiment

In the first embodiment, description has been provided on a configuration in which the stuck-at fault test register with scan design is separately provided in the semiconductor integrated circuit to test stuck-at faults.

In the present embodiment, in particular, description is provided on a configuration in which a register in a BIRA circuit is used as a stuck-at fault test register, the BIRA circuit producing a repair code based on a comparison result produced by a BIST circuit for testing a memory circuit.

Figure 2:
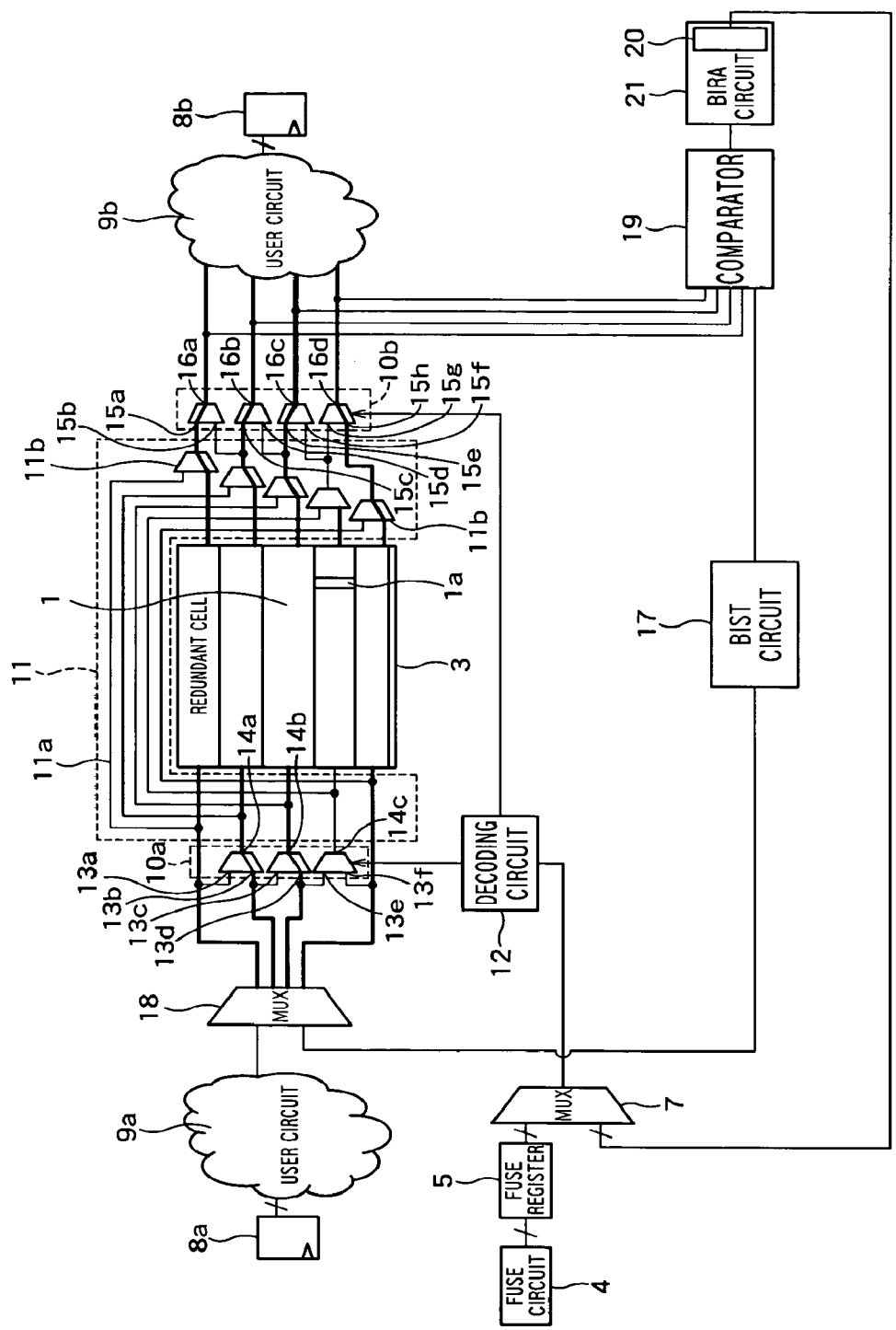
FIG. 2 is a block diagram illustrating a configuration of a principal part of a semiconductor integrated circuit according to a second embodiment of the present invention.

FIG. 2 is a block diagram illustrating a configuration of a principal part of a semiconductor integrated circuit according to a second embodiment of the present invention. In the figure, the same references as in the first embodiment indicate the same components as in the first embodiment.

As shown in FIG. 2, a semiconductor integrated circuit 100a further includes a BIST (built-in self test) circuit 17 for outputting a test pattern for testing the memory cells 1 and an expectation value for examining faults in the memory cells 1; a test switching circuit (MUX) 18 for performing switching between output signals of the first user circuit 9a and the test pattern outputted by the BIST circuit 17 to allow output to the memory circuit 3 through the first switching circuit 10a; a comparator 19 for comparing signals outputted by the memory circuit 3 through the second switching circuit 10b with the expectation value outputted by the BIST circuit 17, based on the input of the test pattern; and a BIRA (built-in redundancy allocation) circuit 21 for determining a repair code based on the signals outputted from the comparator 19, for storage in a storage register 20 having a scan design.

It should be appreciated that the stuck-at fault test register, or a second register, also serves as the storage register 20.

The storage register 20 stores the repair code determined by the BIRA circuit 21, as described above, however, once a fuse element of the fuse circuit 4 is blown based on the repair code to establish a repair logic, the repair code is no longer necessary to be kept stored. Therefore, when testing stuck-at faults, the scan-designed storage register 20 is used as the stuck-at fault test register. In order that the storage register 20 serves as the stuck-at fault test register as well, an input of the register selection circuit 7 and an output of the storage register 20 are connected to each other.

Hereinafter is described a stuck-at fault test of the semiconductor integrated circuit 100a having the configuration as described above. Description here is provided for the case where the stuck-at fault test is carried out in the semiconductor integrated circuit 100a, with the memory circuit 3 being in a state of being repaired. As to the test of delay faults, the same is applicable as in the first embodiment 1.

The test of stuck-at faults is performed by, for example, inputting a predetermined signal from the first flip-flop 8a, controlling the storage register 20 and the memory bypass circuit 11, detecting signals outputted to the second flip-flop, and comparing the detected signals with a predetermined expectation value. Thus, the test of stuck-at faults is carried out for the first and second user circuits 9a and 9b, the first and second switching circuits 10a and 10b, and the decoding circuit 12.

When performing the stuck-at fault test, the memory bypass circuit 11 switches the multiplexers 11b so that the output signals from the memory circuit 3 are not outputted to the second switching circuit 10b and that the signals bypass the memory circuit 3.

As described above, being provided with a scan design, the storage register 20 has a scan register having a test input and a test output. Accordingly, all the stuck-at faults can be tested by writing any test pattern from the test input and the test output into the storage register 20 that has been selected by the register selection circuit 7, and by decoding the test pattern by the decoding circuit 12.

Owing to the repair of the memory circuit 3, whatever repair codes are written into the fuse circuit 4, the output of the fuse circuit 4 is not inputted to the storage register 20, whereby no influence is brought to a test pattern for testing stuck-at faults. Thus, a test pattern for testing stuck-at faults does not have to be prepared for every repair code.

As described above, according to the semiconductor integrated circuit of the present embodiment, the storage register of the BIRA circuit, which is not used in testing stuck-at faults, is used as the stuck-at fault test register. Thus, stuck-at faults in the user circuits and throughout the repair circuit can be tested without separately providing a stuck-at fault test register. At the same time, the test pattern for delay faults in the user circuits, which performs reading/writing of memory, can be produced as a pattern without relying on a repair code. As a result, costs for testing stuck-at faults and delay faults can be further reduced.

Third Embodiment

In the first embodiment, description has been provided in detail on a configuration of the semiconductor integrated circuit.

In the present embodiment, description is provided, in particular, on a design support software system for supporting a test circuit design of the semiconductor integrated circuit.

Figure 3:
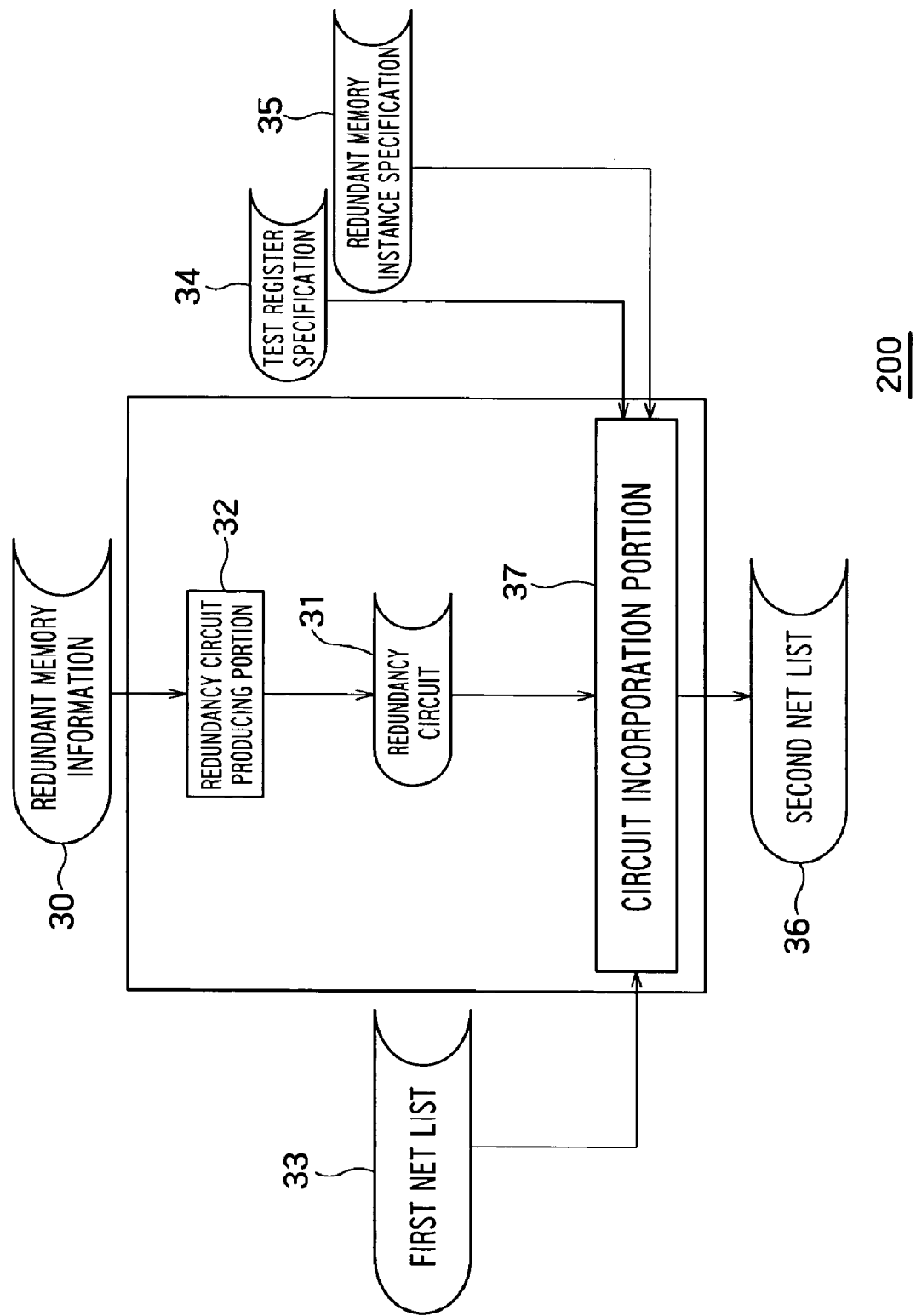
FIG. 3 illustrates a design support software system according to a third embodiment of the present invention.

FIG. 3 illustrates a design support software system according to the present embodiment. What is described here is the case where the design support software system produces a redundancy circuit file for the first embodiment, for incorporation into a net list of the semiconductor integrated circuit.

As shown in FIG. 3, a design support software system 200 includes a redundancy circuit producing portion 32 for producing a redundancy circuit file 31 based on an input from a redundant memory information file 30; and a circuit incorporation portion 37 for producing a second net list 36 in which redundancy circuits are incorporated based on inputs from the redundancy circuit file 31, a first net list 33 of the semiconductor integrated circuit subjected to incorporation of the redundancy circuits, a stuck-at fault test register specifying file 34 for specifying a stuck-at fault test register, and a redundant memory instance specifying file 35.

The redundant memory information file 30 includes, for example, information on cell names and on address width/bit width repair processes for a memory circuit having a redundant cell, the memory circuit being subjected to addition of the redundancy circuits (i.e., the fuse register, the stuck-at fault test register, the register selection circuit, the decoding circuit, and the first and second switching circuits).

In the redundancy circuit file 31, circuit configurations of the redundancy circuits are defined. It should be appreciated that the stuck-at fault test register is scan designed sometime after or before incorporation, but the fuse register is not scan designed.

Types of the stuck-at fault test register and the register selection circuit to be added are specified in the stuck-at fault test register specifying file 34.

A logical location of the memory circuit in the semiconductor integrated circuit is specified in the redundant memory instance specifying file 35.

The second net list 36 outputted by the design support software system 200 is used for designing the semiconductor integrated circuit of the first embodiment.

As described above, according to the design support software system according to the present embodiment, the redundancy circuit file for the semiconductor integrated circuit of the first embodiment can be automatically produced for incorporation into the net list of the semiconductor integrated circuit.

Fourth Embodiment

In the third embodiment, description has been provided on the configuration of the design support software system for the semiconductor integrated circuit of the first embodiment.

In the present embodiment, description is directed to a configuration of a design support software system for the semiconductor integrated circuit of the second embodiment.

Figure 4:
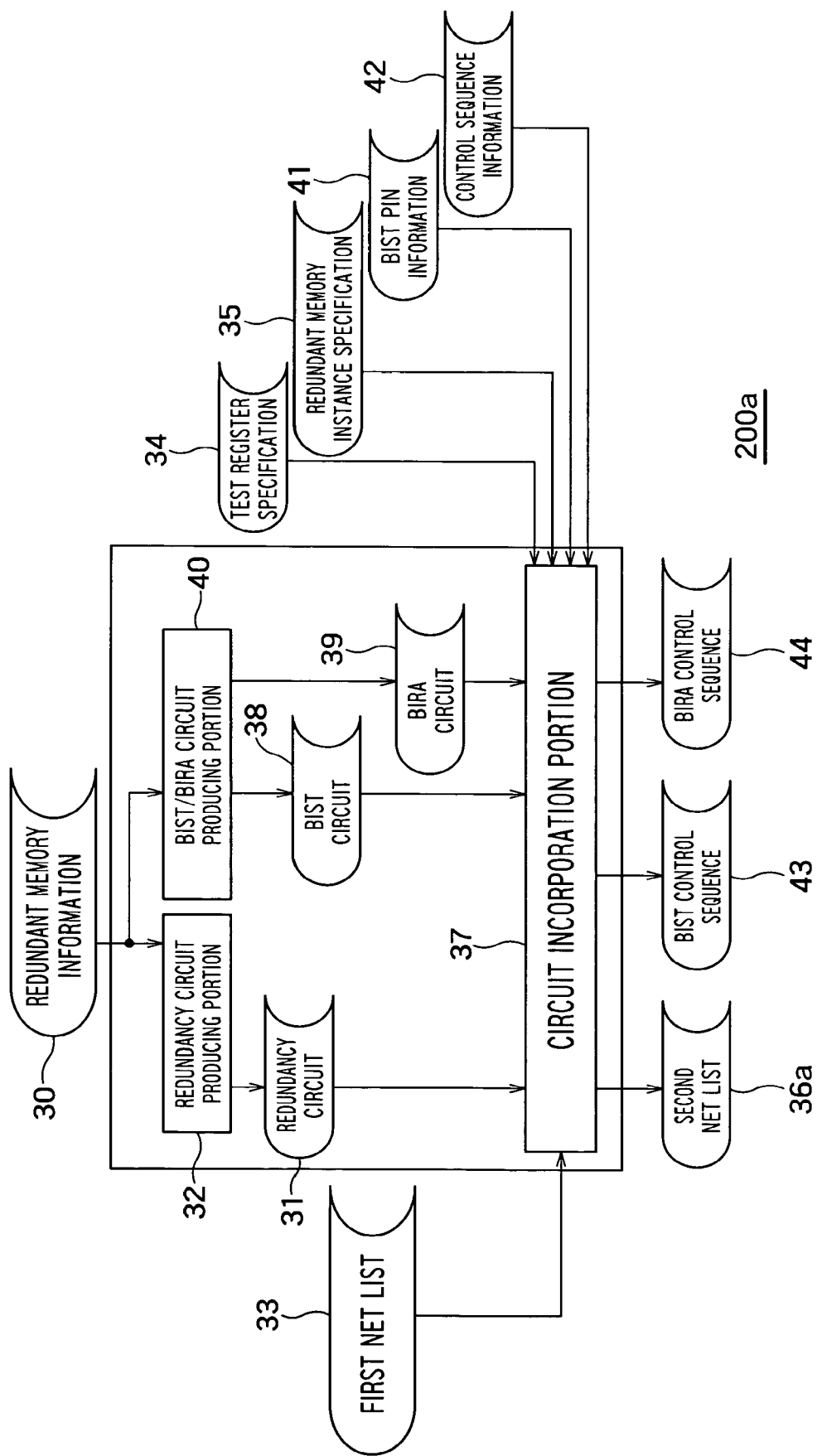
FIG. 4 illustrates a design support software system according to a fourth embodiment of the present invention.

FIG. 4 illustrates a design support software system according to the present embodiment. What is described here is the case where the design support software system produces a redundancy circuit file for the second embodiment, for incorporation into the semiconductor integrated circuit. In the figure, the same references as in the third embodiment indicate the same components as in the third embodiment.

As shown in FIG. 4, a design support software system 200a further includes a BIST/BIRA circuit producing portion 40 for producing a BIST circuit file 38 for defining a circuit configuration of the BIST circuit based on an input from the redundant memory information file 30, and for producing a BIRA circuit file 39 for defining a circuit configuration of the BIRA circuit which determines a repair code based on the results of a test made by the BIST circuit.

The circuit incorporation portion 37 produces a second net list 36a in which the redundancy circuits, the BIST circuit and the BIRA circuit are incorporated, based on inputs from the redundancy circuit file 31, the first net list 33, the stuck-at fault test register specifying file 34, the BIST circuit file 38, the BIRA circuit file 39, and a BIST pin information file 41 in which information on terminals for inputting predetermined signals is defined. The semiconductor integrated circuit of the second embodiment is designed based on the second net list 36a outputted by the design support software system 200a.

The circuit incorporation portion 37 produces a BIST control sequence file 43 and a BIRA control sequence file 44 based on inputs from the BIST circuit file 38, the BIRA circuit file 39, the BIST pin information file 41, and a sequence information file 42 for defining control sequence information of the BIST circuit and the BIRA circuit. Fault detection operation of the memory circuit in the semiconductor integrated circuit of the second embodiment is controlled by the thus produced BIST control sequence file 43 and the BIRA control sequence file 44, whereby a repair code is determined.

In order to allow the stuck-at fault test register to also serve as the storage register for the BIRA circuit, the name of the storage register is specified in the test register specifying file 34.

As described above, according to the design support software system according to the present embodiment, the files for the redundancy circuits described in the second embodiment, the BIST circuit and the BIRA circuit can be automatically produced for incorporation into the net list of the semiconductor integrated circuit.

Fifth Embodiment

In the first and second embodiments, descriptions have each been provided in detail on the configurations of the semiconductor integrated circuits. In the present embodiment, in particular, description is directed to an automatic test pattern generation system for automatically generating test patterns for testing stuck-at faults and delay faults in the semiconductor integrated circuits.

Figure 5:
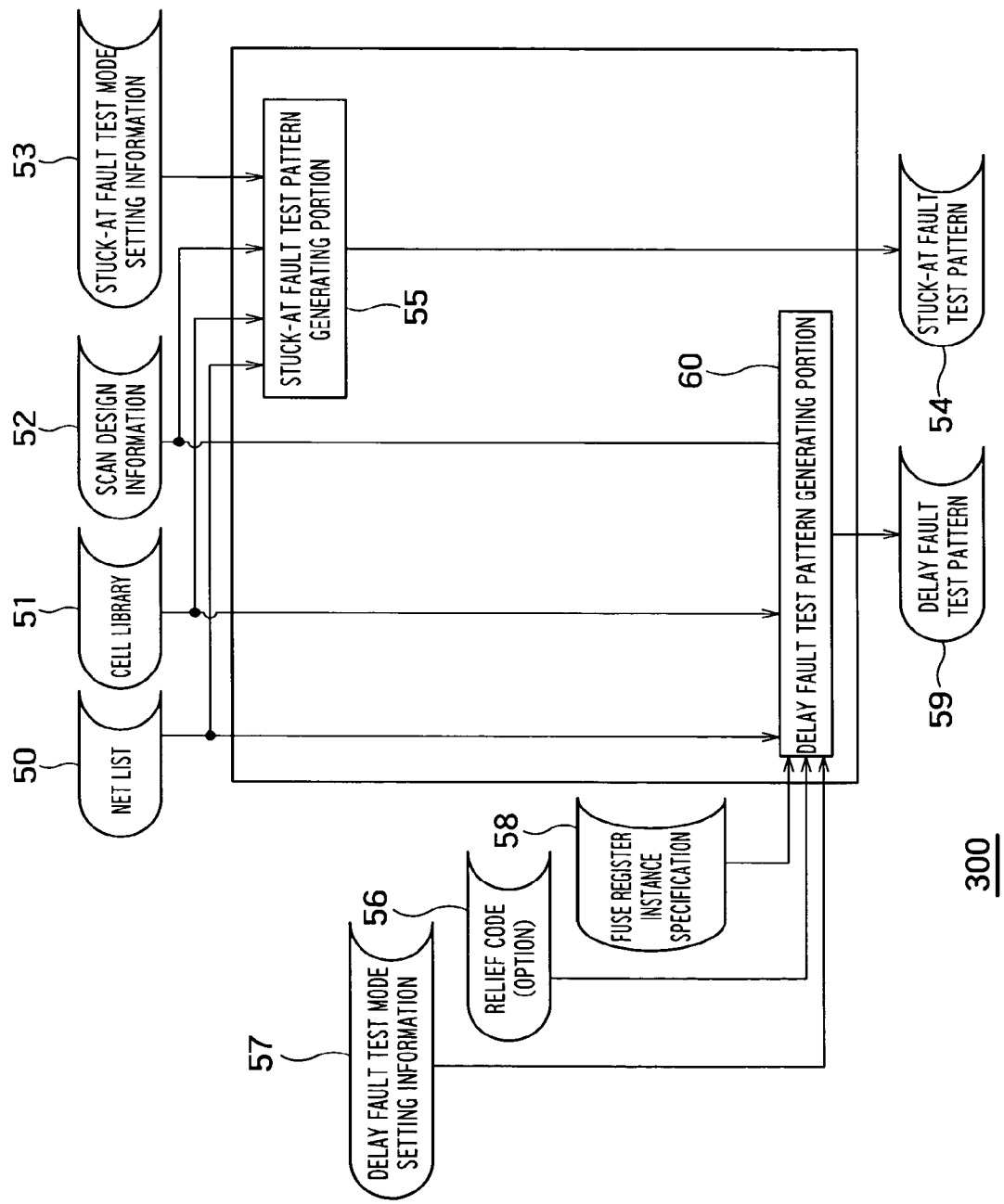
FIG. 5 illustrates an automatic test pattern generation system according to a fifth embodiment of the present invention.

FIG. 5 illustrates an automatic test pattern generation system according to the present embodiment. Description here is directed, in particular, to an automatic test pattern generation system for automatically generating test patterns for the semiconductor integrated circuits of the first and second embodiments.

As shown in FIG. 5, an automatic test pattern generation system 300 includes a stuck-at fault test pattern generating portion 55 for generating a stuck-at fault test pattern file 54 based on inputs from a net list 50 in which the redundancy circuits are incorporated, a cell library 51, a scan design information file 52 for defining a scan design of each of the semiconductor integrated circuits, and a stuck-at fault test mode setting information file 53 for specifying a test's being for stuck-at faults (first fault test); and a delay fault test pattern generating portion 60 for generating a delay fault test pattern file 59 based on inputs from the net list 50, the cell library 51, the scan design information file 52, an optional repair code file 56, a delay fault test mode setting information file 57 for specifying a test's being for delay faults (second fault test) and a fuse register instance specifying file 58.

The cell library 51 includes cell information in ASIC (application specific integrated circuit) technology. The cell information includes information, for example, that a desired cell corresponds to an AND gate.

The fuse resistance instance specifying file 58 includes information indicative of a logical location of the fuse register in the net list 50.

When generating a stuck-at fault test pattern, a repair code is not required to be set in the fuse register, but a mode's being a stuck-at fault mode is specified by the stuck-at fault test mode setting information file 53.

As to the stuck-at faults of the entire circuit portions of the first and second switching circuits, they can all be tested by controlling the decoding circuit with the aid of the stuck-at fault test register or the storage register. The stuck-at faults of the decoding circuit can also be tested simultaneously with the first and second switching circuits by inputting/outputting the stuck-at fault test pattern.

On the other hand, when generating a delay fault test pattern, an appropriate repair code is set in the fuse register specified by the fuse register instance specifying file 58 to generate a pattern. A repair code to be set can be specified by the repair code file 56, but when making no specification, the delay fault test pattern generating portion 60 sets a suitable repair code.

Since the fuse register, per se, is not scan designed, even with such a suitable repair code, a delay fault test pattern can be generated if control for the first and second switching circuits has been uniquely determined by the repair code.

However, there is a difference for repair codes with respect to the actual semiconductor integrated circuits which a delay fault test pattern is applied. Thus, portions of the first and second switching circuits to be tested for delay faults are not determined by the test pattern but by every repair code that has been written in the fuse circuit. In other words, delay faults subjected to test are the ones present in portions through which data passes in an actual operation after repair.

In order to confirm that a generated test pattern is a correct one, the net list 50 as well as the stuck-at fault test pattern file 54 and the delay fault test pattern file 59 may be inputted, for verification, to a test pattern verification simulator, not shown.

Finally, the stuck-at fault test pattern file 54 and the delay fault test pattern file 59 are used to test a semiconductor integrated circuit with the aid of an external tester, not shown, for testing the semiconductor integrated circuit.

As described above, according to the automatic test pattern generation system of the present embodiment, delay fault test patterns and stuck-at fault test patterns not relying on individual repair codes can be automatically generated for the semiconductor integrated circuits described in the first and second embodiments.

What is claimed is:

1. A design support software system configured to support a test circuit design of a semiconductor integrated circuit comprising a memory circuit having memory cells and a redundant cell for avoiding a faulty cell among the memory cells, in which fault has occurred, to achieve repair;

a fuse circuit in which a logic for repairing said memory circuit is determined based on a repair code for avoiding said faulty cell detected as a result of testing said memory circuit and for using the redundant cell;

a first register which is controlled by output signals from said fuse circuit; a second register having a scan design and having a test input and test output;

a register selection circuit having an input to which an output of said first register and an output of said second register are connected, and performing switching between output signals of said first register and output signals of said second register to output signals;

a first switching circuit which is connected between a first user circuit and inputs of said memory circuit, and switches the inputs of said memory circuit from a first signal path including a path to which said faulty cell is connected to a second signal path including a path to which said redundant cell is connect for avoiding the path to which said faulty cell is connected;

a second switching circuit which is connected between a second user circuit and outputs of said memory circuit, and switches the output of said memory circuit from said first signal path to said second signal path;

a memory bypass circuit which is located between said first switching circuit and said second switching circuit, and connected to the inputs and the outputs of said memory circuit; and a decoding circuit configured to output signals for controlling said first switching circuit and said second switching circuit based on an output from said register selection circuit comprising:

a redundancy circuit producing portion configured to produce a redundancy circuit file based on an input from a redundant memory information filed including information on cell names and on address width/bit width repair processes of said memory circuit; and a circuit incorporation porting configured to produce a second net list in which redundancy circuits are incorporated, based on imputer from said redundancy circuit file a first net list of said semiconductor integrated circuit which is subjected to incorporation of said redundancy circuits, a fault test register specifying file for specifying a second register, and a redundant memory instance specifying fir of specifying a logical location of said memory circuit, wherein said register selection circuit is switched to the output signals of said first register when performing testing by way of said memory circuit, and switched to output signals of said second register when performing testing by way of said memory bypass circuit.

2. A design support software system configured to support a test circuit design of a semiconductor integrated circuit comprising a memory circuit having memory cells and a redundant cell for avoiding a faulty cell among the memory cells, in which fault has occurred, to achieve repair;

a first circuit in which a logic for repairing said memory circuit is determined based on a repair code for avoiding said faulty cell detected as a result of testing said memory circuit and for using the redundant cell;

a first register which is controlled by output signals from said fuse circuit; a second register having a scan design and having a test input and a test output;

a register selection circuit having an input to which an output of said first register and an output of said second register are connected, and performing switching between output signals of said first register and output signals of said second register to output signal;

a first switching circuit which is connected between a first user circuit and inputs of said memory circuit, and switches and inputs of said memory circuit for a first signal path including a path to which said faulty cell is connected to a second signal path including a path to which said redundant cell is connected for avoiding the path to which said faulty cell is connected;

a second switching circuit which is connection between a second user circuit and outputs of said memory circuit and switches the output of said memory circuit from said first signal path to said second signal path;

a memory bypass circuit which is located between said first switching circuit and said second switching circuit, and connect to the inputs and the outputs of said memory circuit, and a decoding circuit configured to output signals for controlling said first switching circuit and said second switching circuit based on a output form said register selection circuit, comprising:

a redundancy circuit producing portion configured to produce a redundancy circuit file based on an input from a redundant memory information file including information on cell names and on address width/bit width repair processes of said memory circuit; and wherein:

said semiconductor integrated circuit further comprises a built-in self test (BIST) circuit configured to output a test pattern for testing said memory cells and an expectation value for making a determination on faults in said memory cells;

a test switching circuit configured to perform switching between the output signals of said first user circuit and said test pattern outputted from said BIST circuit for output to said memory circuit through said first switching circuit;

a comparator configured to compare signals outputted from said memory circuit through said second switching circuit, with an expectation value outputted from said BIST circuit based on the input of said test pattern;

a built in redundancy allocation (BIRA) circuit configured to determine said repair code and storing said repair code in a storage registers, based on output signals of said comparator;

said second register serves as said storage register whose output is connected to an input of said register selection circuit;

said design support software system further comprises a BIST/BIRA circuit producing portion configured to produce a BIST circuit file for defining circuit configuration of said BIST circuit based on an input from said redundant memory information file and a BIRA circuit file for defining a circuit configuration of said BIRA circuit;

a name of said storage resister configured to store said repair code is specified in said fault test register specifying file;

said circuit incorporation portion produces a second net list in which said redundancy circuits, said BIST circuits and said BIRA circuit file and a BIST pin information file for defining information terminals for inputting predetermined signals; and wherein said register selection circuit is switched to the output signals of said first register when performing testing by way of said memory circuit, and switched to output signals of said second register when performing testing by way of said memory bypass circuit.

* * * * *